US007839702B2

(12) United States Patent
Norman

(10) Patent No.: US 7,839,702 B2
(45) Date of Patent: Nov. 23, 2010

(54) THREE-DIMENSIONAL NON-VOLATILE REGISTER WITH AN OXYGEN-ION-BASED MEMORY ELEMENT AND A VERTICALLY-STACKED REGISTER LOGIC

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/800,289

(22) Filed: May 11, 2010

(65) Prior Publication Data

US 2010/0238713 A1 Sep. 23, 2010

Related U.S. Application Data

(63) Continuation of application No. 12/012,641, filed on Feb. 5, 2008, now Pat. No. 7,715,244.

(51) Int. Cl.
*G11C 7/10* (2006.01)
(52) U.S. Cl. .............................. 365/189.14; 365/189.07; 365/189.08; 365/189.09; 365/189.05; 365/153; 365/148; 365/51; 365/63
(58) Field of Classification Search ............ 365/189.14, 365/189.05, 189.07, 189.08, 189.09, 51, 365/63, 148, 163, 151, 153
See application file for complete search history.

(56) References Cited

U.S. PATENT DOCUMENTS 7,715,244 B2 * 5/2010 Norman .................. 365/189.05

* cited by examiner

*Primary Examiner*—Andrew Q Tran

(57) ABSTRACT

A non-volatile register includes a memory element. The memory element comprises a first end and a second end. The non-volatile register includes a register logic connected with the first and second ends of the memory element. The register logic is positioned below the memory element. The memory element may be a two-terminal memory element configured to store data as a plurality of conductivity profiles that can be non-destructively determined by applying a read voltage across the two terminals. New data can be written to the two-terminal memory element by applying a write voltage of a predetermined magnitude and/or polarity across the two terminals. The two-terminal memory element retains stored data in the absence of power. A reference element including a structure that is identical or substantially identical to the two-terminal memory element may be used to generate a reference signal for comparisons during read operations.

20 Claims, 6 Drawing Sheets

THREE-DIMENSIONAL NON-VOLATILE REGISTER WITH AN OXYGEN-ION-BASED MEMORY ELEMENT AND A VERTICALLY-STACKED REGISTER LOGIC

FIELD OF THE INVENTION

The present invention relates to semiconductors and, more particularly, to a non-volatile register.

BACKGROUND

A register can be a portion of a hardware used as a storage location. An example of a register can include a portion of a central processor unit used for storage of information. Another example of a register can include a portion of a video memory used for storage by video graphic cards. Information stored in a register can include configuration information, information associated with the initialization of the hardware, and other information.

Flash memory may be configured as a register. However, flash memory requires high voltage charge pumps that require specialized designs. Furthermore, flash memory requires complex programming algorithms that result in a large amount of logic. Electronically Erasable Programmable Read-Only Memory (EEPROM) also may be configured as a register. Still, the EEPROM requires a charge pump and the process of configuring the EEPROM as a register is complicated and is subject to a high failure rate. As a result, there is a need for continuing efforts to improve non-volatile registers.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

DETAILED DESCRIPTION

A detailed description of one or more embodiments is provided below along with accompanying figures. The detailed description is provided in connection with such embodiments, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

The embodiments described herein non-volatile registers and methods for accessing the non-volatile registers. The non-volatile register includes one or more memory elements and a register logic. In an embodiment, the memory element is disposed above the register logic. As will be explained in more detail below, register logic may include circuitries, such as comparator and switches, to access the memory element.

Figure 1:
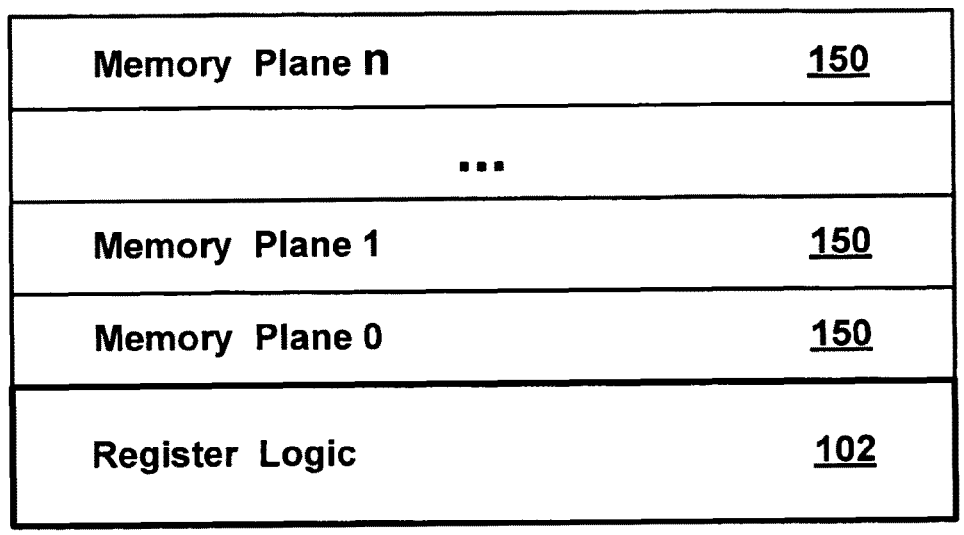
FIG. 1 is a simplified block diagram of a non-volatile register, in accordance with an embodiment.

FIG. 1 is a simplified block diagram of a non-volatile register 106, in accordance with an embodiment. Non-volatile register 106 may be a third dimension memory. A third dimension memory, which is connected with the register logic 102 and may be disposed above the register logic 102, may include one or more memory elements that are vertically configured along multiple memory planes 150. Register logic 102 may include a variety of logic and/or circuitry that is associated with the access of the third dimension memory. For example, as explained in more detail below, register logic 102 may include a comparator for reading data from the third dimension memory and further include switches for switching the polarity of voltages in a write operation. Memory planes 150 can be implemented to emulate various types of memory technologies that permit different physical and logical arrangements (e.g., vertically stacked). A memory is "third dimension memory" when the memory is fabricated above other circuitry components, the components usually including a silicon substrate, polysilicon layers, and metallization layers. By using non-volatile third dimension memory, non-volatile memory registers (and latches) may be vertically-configured to reduce die size and not sacrifice overall chip functionality.

A third dimension memory can include one or more two-terminal memory elements where, as shown in the embodiment of FIG. 1, the memory elements in the form of memory planes 150 may be stacked on top of or disposed above register logic 102. U.S. patent application Ser. No. 11/095,026, filed Mar. 30, 2005, U.S. Published Application No. 2006/0171200, and titled "Memory Using Mixed Valence Conductive Oxides," hereby incorporated by reference in its entirety and for all purposes, describes two-terminal memory elements that can be arranged in a cross-point array. The application describes a two-terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

Both the electrolytic tunnel barrier and the mixed valence conductive oxide do not need to operate in a silicon substrate, and, therefore, can be fabricated above circuitry being used for other purposes (such as register logic 102). The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½-$V_{W1}$ to the y-direction line) it switches to a low resistive state. When a second write voltage $V_{W2}$ is applied across the memory element, (typically by applying ½ $V_{W2}$ to the x-direction line and ½-$V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Figure 2:
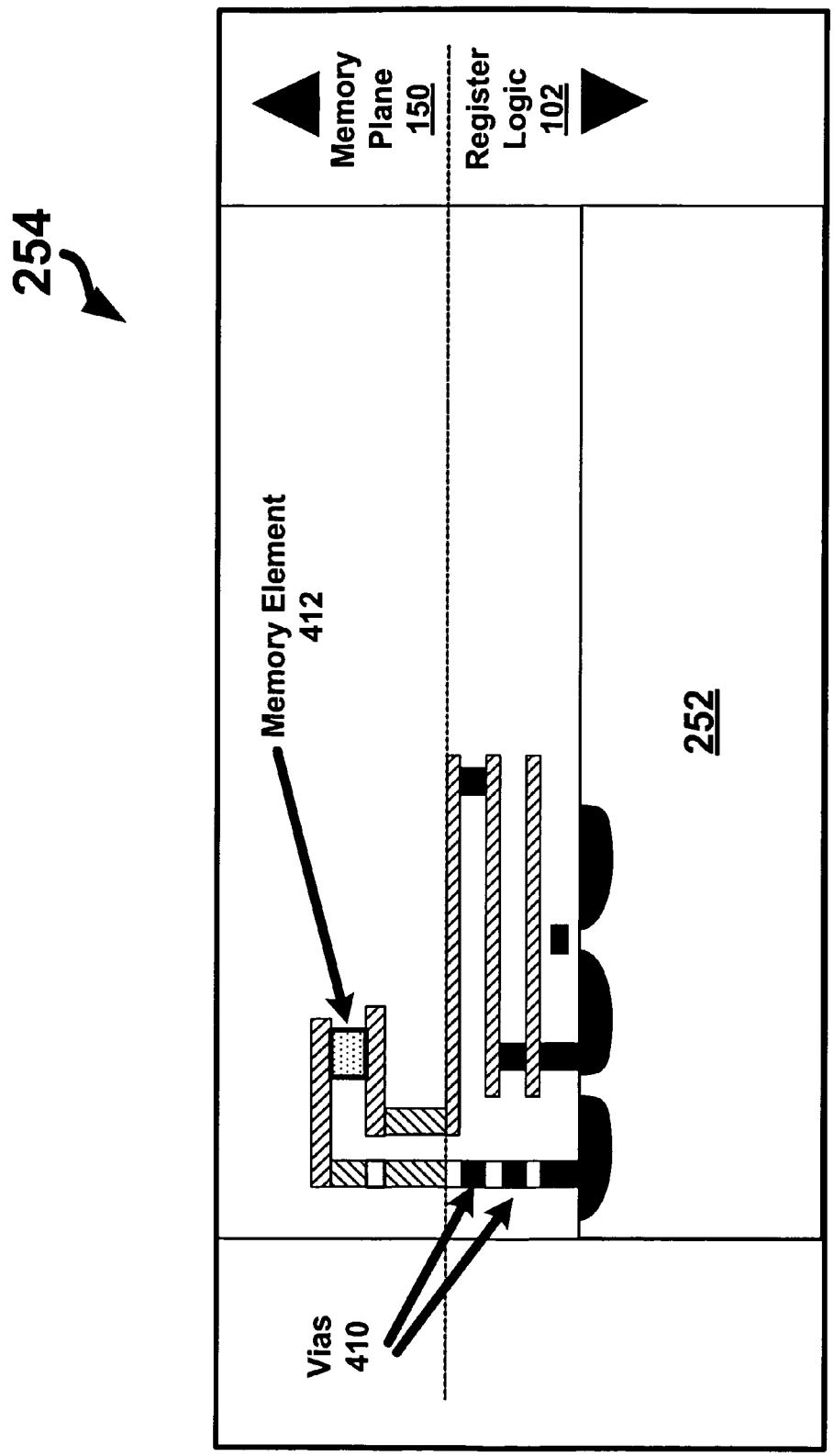
FIG. 2 is a diagram of a cross-section of a non-volatile register that is vertically configured, in accordance with an embodiment.

FIG. 2 is a diagram of a cross-section of a non-volatile register that is vertically configured, in accordance with an embodiment. As shown in FIG. 2, memory plane 150 is disposed above register logic 102. In turn, register logic 102 is disposed above substrate 252. Memory plane 150 includes one more memory elements, such as memory element 412. Memory element 412 is electrically connected with register logic 102 by way of an interconnect structure, such as one or more vertically configured vias 410, for example. As explained in more detail below, register logic 102 may include a variety of logic and/or circuitry that is associated with the access of memory element 412.

Figure 3:
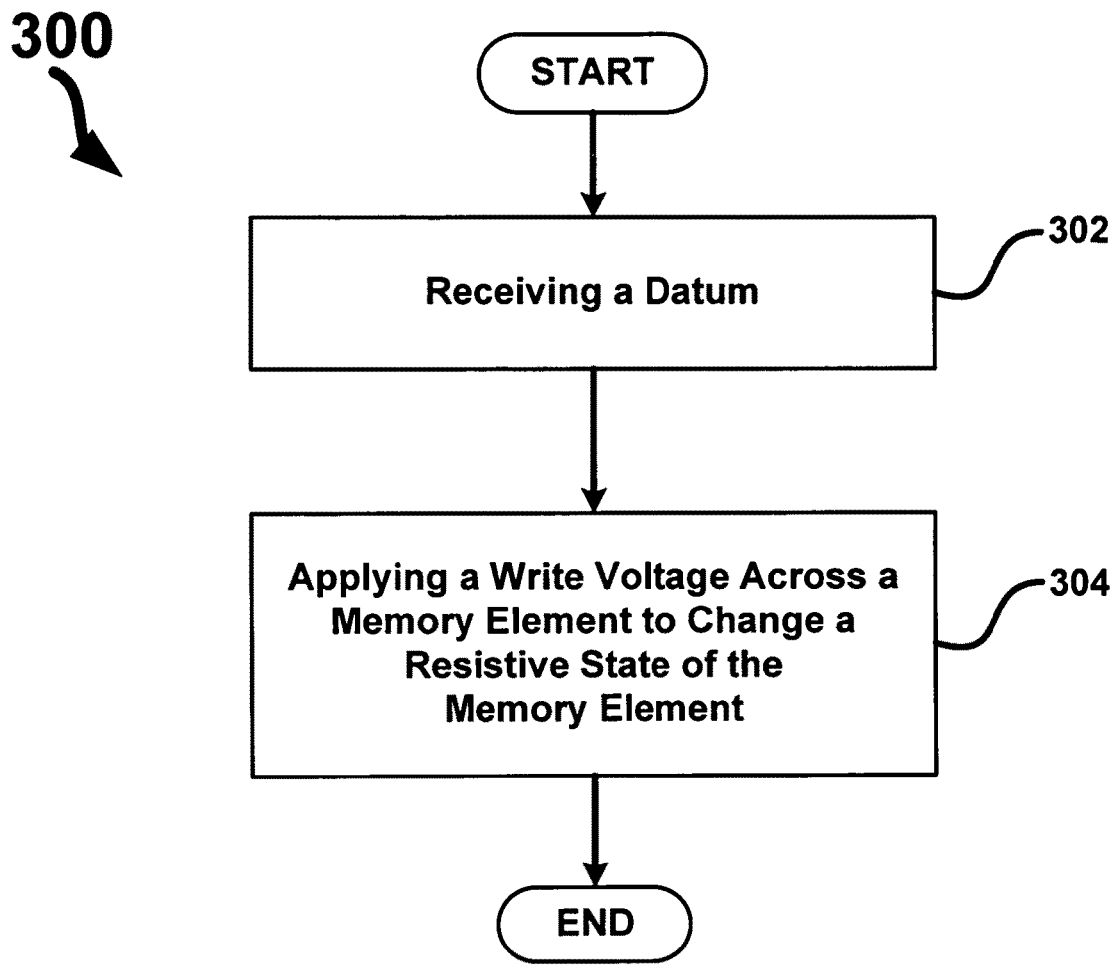
FIG. 3 is a flowchart diagram of a high level logic overview for writing data to a non-volatile register, in accordance with an embodiment.

FIG. 3 is a flowchart diagram 300 depicting a high level logic overview for writing data to a non-volatile register, in accordance with an embodiment. At a stage 302, a register logic receives a datum or a plurality of data to be written to the non-volatile register. The non-volatile register is comprised of one or more memory elements. As discussed above, the memory element may be configured to store the datum based on the resistive state of the memory element. To write the datum in the memory element, a write voltage is applied across the memory element at a stage 304 to change or switch the memory element to a high or low resistive state. The high or low resistive state may correspond to a value of one or zero, which can correspond to the value of the datum.

The resistive state of the memory element can be changed with the application of one or more write voltages with a voltage potential. In an embodiment, the resistive state of the memory element can depend on the polarity of the applied write voltages. In other words, write voltages with different polarities can be applied across a memory element to create the voltage potential. For example, a positive polarity may switch the memory to a high resistive state. Vice versa, a negative polarity may switch the memory to a low resistive state. The polarity of the write voltage therefore may depend on or is based on the value of the datum. Accordingly, the polarity of the applied write voltage can be switched based on the received datum. For example, if the datum is a value of one, then the polarity of the write voltage may be switched to a positive polarity. On the other hand, for example, if the datum is a value of zero, then the polarity of the write voltage may be switched to a negative voltage. In another embodiment, the applied write voltages can have a single polarity. Here, the applied write voltages can be either positive or negative. As will be explained in more detail below, the voltage potential associated with the write voltages is created by the difference between the single polarity write voltages.

Figure 4:
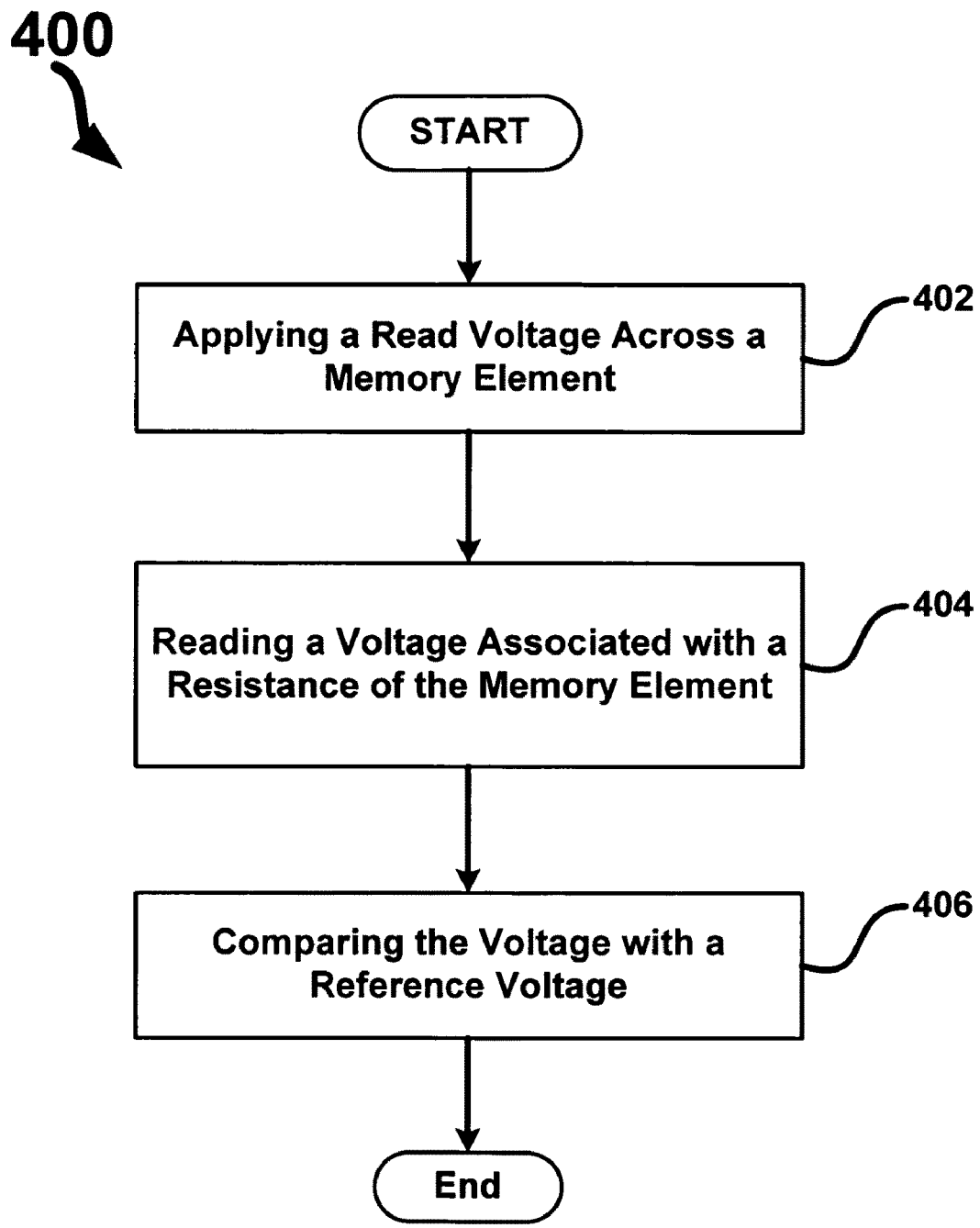
FIG. 4 is a flowchart diagram of a high level logic overview for reading data from a non-volatile register, in accordance with an embodiment.

FIG. 4 is a flowchart diagram 400 depicting a high level logic overview for reading data from a non-volatile register, in accordance with an embodiment. During a read operation, to read a datum or data stored in one or more memory elements, a read voltage is applied across the memory element at a stage 402. With the read voltage applied, the voltage associated with the resistance of the memory element is read at a stage 404. The voltage associated with the resistance of the memory element is then compared with a reference voltage at a stage 406. The comparison defines a comparison output that defines or corresponds to the value of the datum stored in the memory element. As explained in more detail below, in an embodiment, the comparison may include sensing a difference between the voltage associated with the resistance of the memory element and the reference voltage.

It should be appreciated that, in another embodiment, the comparison may be based on the current instead of the voltage. Here, during a read operation, a read voltage is applied across the memory element. With the read voltage applied, the current associated with the resistance of the memory element is read and compared to a reference current. As explained in more detail below, in an embodiment, the comparison may include sensing a difference between the current associated with the resistance of the memory element and a reference current.

Figure 5:
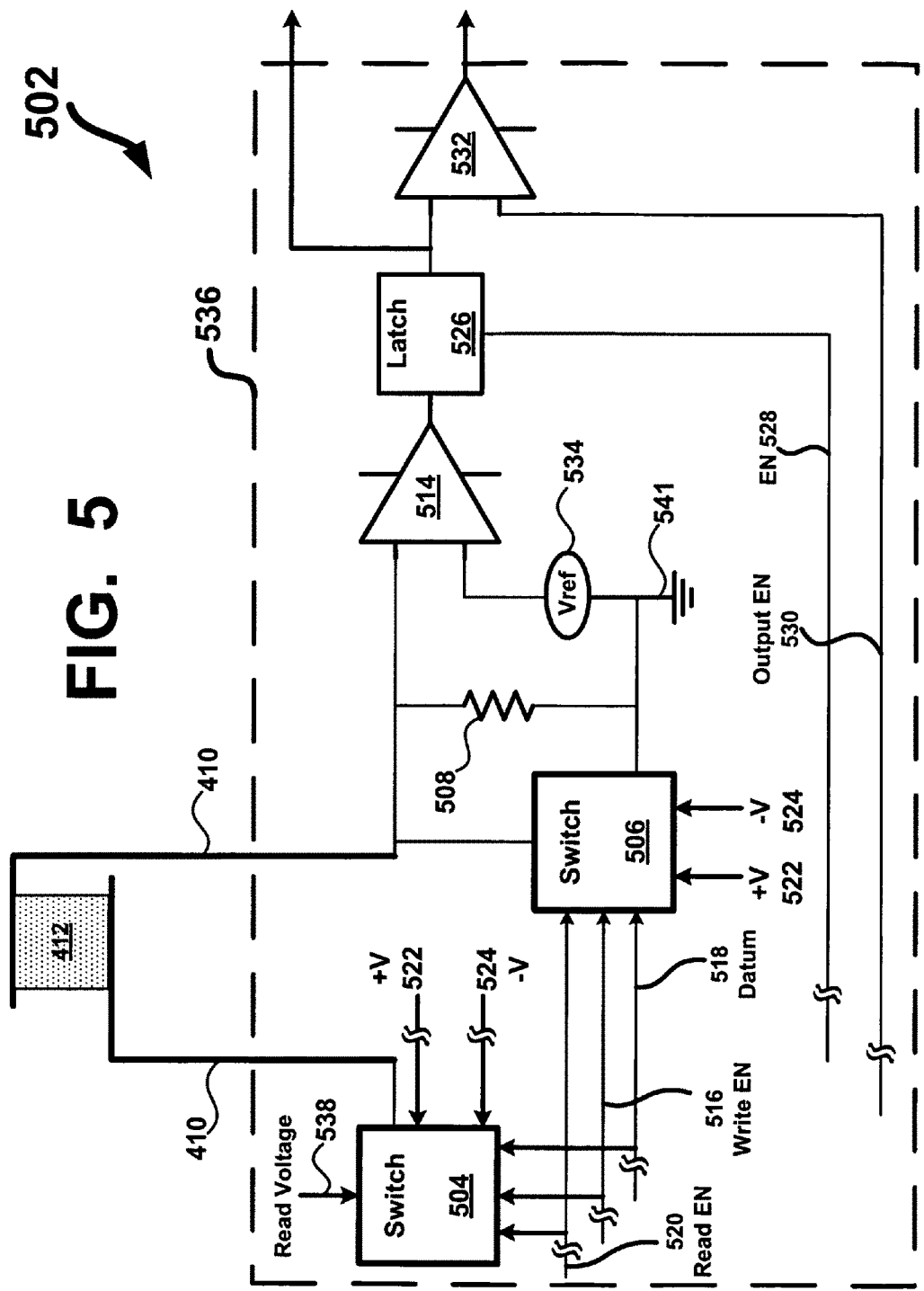
FIG. 5 is a circuit diagram of a non-volatile register, in accordance with an embodiment.

FIG. 5 is a circuit diagram of a non-volatile register, in accordance with an embodiment. Non-volatile register 502 includes memory element 412 and register logic 536. In an embodiment, register logic 536 is configured to be disposed below memory element 412. Register logic 536 includes switches 504 and 506, resistor 508, comparator 514, latch 526, and operational amplifier 532. In an embodiment, comparator 514 may be an operational amplifier. As shown in FIG. 5, memory element 412 has two ends that are connected with register logic 536. One end of memory element 412 is connected with switch 504 by way of via 410. The other end of memory element 412 is connected with switch 506, an end of resistor 508, and an input of comparator 514 by way of via 410. Switch 504 is connected with switch 506, and switch 506 also is connected with a ground 541. Another end of resistor 508 also is connected with the ground 541. The other input of comparator 514 is connected with a biased reference, such as voltage reference 534. The output of comparator 514 is connected with latch 526 and the latch is connected with operational amplifier 532.

In a write operation, switches 504 and 506 are enabled by write enable signal 516 such as to receive datum 518. To write data in memory element 412, write voltages 522 and 524 are applied across memory element 412. Examples of write voltages 522 and 524 that may be applied across memory element 412 include ±3 volts, ±7 volts, and other write voltages. In an embodiment, to create a voltage potential, a positive write voltage and a negative write voltage may be applied across memory element 412. For example, a positive voltage may be applied to switch 504 and a negative voltage may be applied to switch 506. Write voltages 522 and 524 have polarities (positive or negative) that are based on datum 518. Switches 504 and 506 are configured to switch the polarities of the write voltages based on datum 518. For example, if the datum 518 is a value of zero, then switch 504 may switch the polarity of write voltage 522 to a negative polarity. At the same time, switch 506 may switch the polarity of write voltage 524 to a positive polarity. On the other hand, for example, if the datum 518 is a value of one, then switch 504 may switch the polarity of write voltage 522 to a positive polarity. At the same time, switch 506 may switch the polarity of write voltage 524 to a negative polarity.

In another embodiment, the applied write voltages 522 and 524 can have a single polarity. Here, to create a voltage potential, the polarities of write voltages 522 and 524 may be all positive or negative. The voltage potential associated with the write voltages 522 and 524 is created by the difference between the single polarity write voltages. For example, a potential voltage difference of +6 volts can be created by applying a +1 write voltage and a +7 write voltage across memory element 412 by way of switches 504 and 506, respectively. In another example, a potential voltage difference of −6 volts can be created by applying a write voltage potential of −1 volts and a write voltage potential of −7 volts across memory element 412 by way of switches 504 and 506, respectively. After the write operation is complete, write voltages 522 and 524 or the write voltage difference can be reduced to zero to minimize the current flow.

In a read operation, switches 504 and 506 are enabled by read enable signal 520 and, to apply read voltage 538 across memory element 412, the read voltage 538 is supplied to switch 504. Comparator 514 includes two inputs that are connected with an end of memory element 412 and switch 406. One input of comparator 514 receives a voltage associated with a resistance of memory element 412. Such voltage is generated by the application of the read voltage 538. The other input of comparator 514 receives reference voltage 534 from, for example, a reference element configured to provide a specific voltage (e.g., a reference voltage).

Comparator 514 (e.g., operational amplifier) is configured to amplify and sense a voltage difference between the voltage associated with a resistance of memory element 412 and reference voltage 534. Depending on the relationship between voltage associated with resistance of memory element 412 and reference voltage 534, comparator 514 outputs a high or low voltage. For example, voltage associated with resistance of memory element 412 that is higher than reference voltage 534 can drive the voltage output (i.e., a comparison output) to a high. On the other hand, voltage associated with resistance of memory element 412 that is lower than reference voltage 534 can drive the voltage output to a low. Conversely, voltage associated with the resistance of memory element 412 that is higher than reference voltage 534 can drive the voltage output to a low, while the voltage associated with the resistance of memory element 412 that is lower than the reference voltage 534 can drive the voltage output to a high. The high or low voltage output corresponds to the value of the datum stored in memory element 412.

Still referring to FIG. 5, the comparison output from comparator 514 may be sampled or stored in latch 526. The comparison output from comparator 514 may be synchronized with enable signal 528 or a clock signal. With output enable signal 530 supplied to operational amplifier 532, the operational amplifier 532 provides a three state output.

Figure 6:
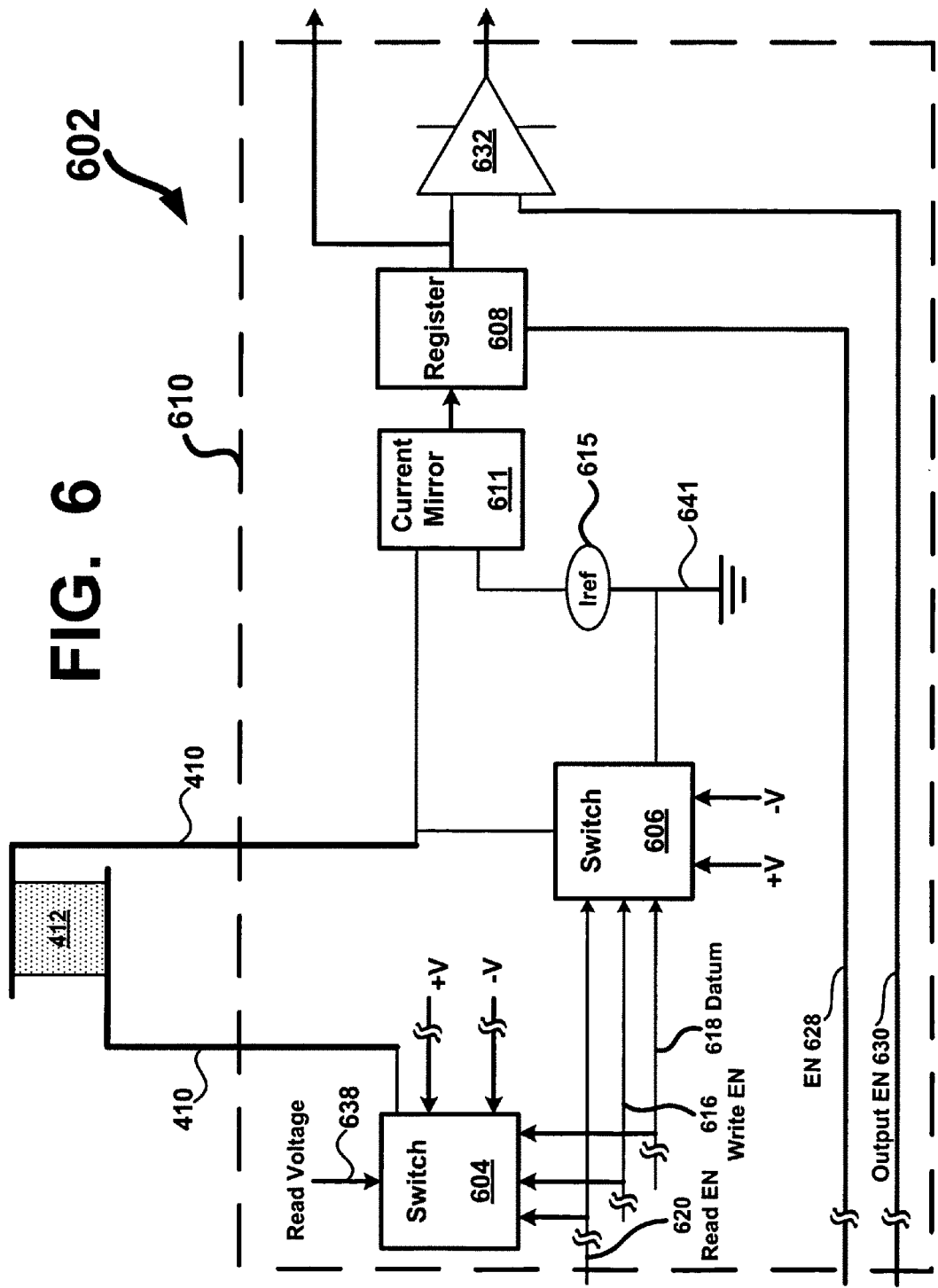
FIG. 6 is a circuit diagram of a non-volatile register, in accordance with another embodiment.

FIG. 6 is a circuit diagram of a non-volatile register, in accordance with another embodiment. It should be appreciated that in another embodiment, the register logic of FIG. 5 may be based on a current mirror that is connected with a register. As shown in FIG. 6, non-volatile register 602 includes memory element 412 and register logic 610. Register logic 610 includes switches 604 and 606, current mirror 611, register 608, and operational amplifier 632. Memory element 412 has two ends that are connected with register logic 610. One end of memory element 412 is connected with switch 604 by way of via 410. The other end of memory element 412 is connected with switch 606 and an input of current mirror 611 by way of via 410. Switch 604 is connected with switch 606, and switch 606 also is connected with a ground 641. The other input of current mirror 611 is connected with a biased reference, such as reference current 615. The output of current mirror 611 is connected with register 608 and the register 608 is connected with operational amplifier 632.

In a read operation, switches 604 and 606 are enabled by read enable signal 620 and, to apply read voltage 638 across memory element 412, the read voltage 638 is supplied to switch 604. Current mirror 611 includes two inputs that are connected with an end of memory element 412 and switch 606. One input of current mirror 611 receives a current associated with a resistance of memory element 412. The current is generated by the application of read voltage 638. The other input of current mirror 611 receives reference current 615 from, for example, a reference element (not shown) configured to generate a specified signal (e.g., a reference current or reference voltage). The reference element may have a structure that is identical to or substantially identical to that of the memory element 412. Moreover, the reference element may be a two-terminal memory element like the memory element 412. The reference element may have a resistance that is between the high and low resistance values of the memory element 412 that represent the datum stored in the memory element 412. For example, in the memory element 412, a high resistance of 1MΩ may represent a logic "1" and a low resistance of 10 kΩ may represent a logic "0", or vice-versa. Therefore, the reference element may have resistance value that is somewhere between 1MΩ and 10 kΩ, such as approximately 500Ω, for example. The reference element may be fabricated in the memory plane 150 of FIG. 2 and positioned above the register logic 102. The reference element may be used to generate the reference voltage 534 described above in FIG. 5. Voltages that are identical to or approximately equal to the voltages applied across the memory element 412 may be applied across the reference element to generate the reference signal, that is, the reference current in FIG. 6 or the reference voltage in FIG. 5.

Current mirror 611 is configured to amplify and sense a current difference between current associated with a resistance of memory element 412 and reference current 615. Depending on the relationship between reference current 615 and current associated with a resistance of memory element 412 (e.g., a read current), current mirror 611 outputs a high current or a low current. For example, current associated with a resistance of memory element 412 that is higher than reference current 615 can drive the current output to a high. However, if current associated with a resistance of memory element 412 is lower than reference current 615, then current mirror 611 can drive the current output to a low. Conversely, current associated with a resistance of memory element 412 that is higher than reference current 615 can drive the current output to a low, while the current associated with the resistance of the memory element 412 that is lower than the reference current 615 can drive the current output to a high.

The comparison output from current mirror 611 may be stored in a second register 698. The comparison output could be synchronized with enable signal 628 or a clock signal. With output enable signal 630 supplied to operational amplifier 632, the operational amplifier 632 provides a three state output. As was described above, the reference current 615 may be generated by the reference element.

Although the foregoing embodiments have been described in some detail for purposes of clarity of understanding, the embodiments are not limited to the details provided. There are many alternative ways of implementing the embodiments. Accordingly, the disclosed embodiments are to be considered as illustrative and not restrictive, and the embodiments are not to be limited to the details given herein, but may be modified within the scope and equivalents of the appended claims. In the claims, elements and/or operations do not imply any particular order of operation, unless explicitly stated in the claims.

What is claimed is:

1. A non-volatile register, comprising:
   a memory element positioned in at least one memory plane and including a first terminal, a second terminal, a conductive oxide including mobile oxygen ions, and an electrolytic tunnel barrier in contact with the conductive oxide, the conductive oxide and the electrolytic tunnel barrier are electrically in series with the first and second terminals; and
   a register logic fabricated on a substrate and operative to read data stored in the memory element during a read operation and to write data to the memory element during a write operation, the write operation operative to move a portion of the mobile oxygen ions between the conductive oxide and the electrolytic tunnel barrier to write the data, the at least one memory plane is fabricated directly above and in contact with the substrate, the register logic is electrically coupled with the first and second terminals of the memory element, the register logic including
      a biased reference electrically coupled with a ground voltage and operative to generate a reference signal on an output node,
      a comparator including a first input, a second input, and an output, the first input is electrically coupled with the second terminal of the memory element and the second input is electrically coupled with the output node of the biased reference,
      a first switch having a first output electrically coupled with the first terminal of the memory element, the first switch electrically coupled with a read enable signal, a write enable signal, a data signal, a read voltage, and a write voltage,
      a second switch having a second output electrically coupled with the second terminal of the memory element and the first input of the comparator, the second switch electrically coupled with the ground voltage, the read enable signal, the write enable signal, the data signal, and the write voltage.

2. The non-volatile register of claim 1, wherein during the read operation the read enable signal is active and the first and second switches are operative to apply the read voltage across the first and second terminals of the memory element, and wherein application of the read voltage is non-destructive to data stored in the memory element.

3. The non-volatile register of claim 1, wherein during the write operation the write enable signal is active and the first and second switches are operative to apply the write voltage across the first and second terminals of the memory element, and wherein the first and second switches select a magnitude and a polarity of the write voltage based on a value of the data signal.

4. The non-volatile register of claim 3, wherein the write voltage comprises a first write voltage potential electrically coupled with the first and second switches and a second write voltage potential electrically coupled with the first and second switches.

5. The non-volatile register of claim 3, wherein the polarity of the write voltage controls a direction of mobile oxygen ion movement between the conductive oxide and the electrolytic tunnel barrier.

6. The non-volatile register of claim 1, wherein the register logic further comprises a resistor including a first node electrically coupled with the first input of the comparator and a second node electrically coupled with the ground voltage.

7. The non-volatile register of claim 1, wherein the electrolytic tunnel barrier has a thickness that is less than approximately 50 Å.

8. The non-volatile register of claim 1, wherein the comparator comprises an operational amplifier.

9. The non-volatile register of claim 1, wherein the comparator comprises a current mirror.

10. The non-volatile register of claim 1, wherein the register logic further comprises a latch electrically coupled with the output of the comparator.

11. The non-volatile register of claim 1, wherein the biased reference comprises a voltage reference.

12. The non-volatile register of claim 1, wherein the biased reference comprises a current reference.

13. The non-volatile register of claim 1, wherein the register logic further comprises another non-volatile register electrically coupled with the output of the comparator.

14. The non-volatile register of claim 1, wherein the memory element stores the data as a plurality of conductivity profiles.

15. The non-volatile register of claim 1, wherein the memory element is one of a plurality of two-terminal memory elements arranged in a two-terminal cross-point memory array.

16. A non-volatile register, comprising:
   a memory element positioned in at least one memory plane and including a first terminal, a second terminal, a conductive oxide including mobile oxygen ions, and an electrolytic tunnel barrier in contact with the conductive oxide, the conductive oxide and the electrolytic tunnel barrier are electrically in series with the first and second terminals, and the memory element operative to store data as a plurality of conductivity profiles; and
   a substrate, the at least one memory plane is fabricated directly above and in contact with the substrate, the substrate including
      a biased reference electrically coupled with a ground voltage and operative to generate a reference signal on an output node,
      a comparator including a first input, a second input, and an output, the first input is electrically coupled with the second terminal of the memory element, and the second input is electrically coupled with the output node of the biased reference,
      a first switch having a first output electrically coupled with the first terminal of the memory element, the first switch electrically coupled with a read enable signal, a write enable signal, a data signal, a read voltage, and a write voltage, and
      a second switch having a second output electrically coupled with the second terminal of the memory element and the first input of the comparator, the second switch electrically coupled with the ground voltage, the read enable signal, the write enable signal, the data signal, and the write voltage.

17. The non-volatile register of claim 16, wherein during a read operation the read voltage is applied across the first and second terminals of the memory element and is operative to generate a read current in the memory element and the comparator compares the read current with at least one signal and generates a signal on the output that is indicative of the data stored in the memory element.

18. The non-volatile register of claim 16, wherein during a write operation the write enable signal is active and the first and second switches are operative to apply the write voltage across the first and second terminals of the memory element, and wherein the first and second switches select a magnitude and a polarity of the write voltage based on a value of the data signal.

19. The non-volatile register of claim 18, wherein the polarity of the write voltage controls a direction of mobile oxygen ion movement between the conductive oxide and the electrolytic tunnel barrier.

20. The non-volatile register of claim 16, wherein the electrolytic tunnel barrier has a thickness that is less than approximately 50 Å.

* * * * *